(12) United States Patent
Fujiwara et al.

(10) Patent No.: US 11,955,160 B2
(45) Date of Patent: Apr. 9, 2024

(54) ASYNCHRONOUS SIGNAL TO COMMAND TIMING CALIBRATION FOR TESTING ACCURACY

(71) Applicant: Micron Technology, Inc., Boise, ID (US)

(72) Inventors: Yoshinori Fujiwara, Boise, ID (US); Kevin G. Werhane, Boise, ID (US); Jason M. Johnson, Boise, ID (US); Daniel S. Miller, Boise, ID (US)

(73) Assignee: Micron Technolgy, Inc., Boise, ID (US)

( * ) Notice: Subject to any disclaimer, the term of this patent is extended or adjusted under 35 U.S.C. 154(b) by 141 days.

(21) Appl. No.: 17/846,967

(22) Filed: Jun. 22, 2022

(65) Prior Publication Data
US 2023/0420030 A1   Dec. 28, 2023

(51) Int. Cl.
*H03K 5/133*       (2014.01)
*G11C 11/4076*   (2006.01)
*G11C 29/54*      (2006.01)

(52) U.S. Cl.
CPC .......... *G11C 11/4076* (2013.01); *G11C 29/54* (2013.01); *H03K 5/133* (2013.01)

(58) Field of Classification Search
CPC ...... G11C 11/4076; G11C 29/54; H03K 5/133
USPC .......................................................... 365/149
See application file for complete search history.

(56) References Cited

U.S. PATENT DOCUMENTS

| | | | |
|---|---|---|---|
| 2010/0151886 A1* | 6/2010 | Swope .................. | H04W 64/00 455/456.5 |
| 2014/0281198 A1* | 9/2014 | Iyer ...................... | G11C 29/022 711/105 |
| 2021/0399722 A1* | 12/2021 | Hamdan ................ | H03L 7/081 |

\* cited by examiner

*Primary Examiner* — Ly D Pham
(74) *Attorney, Agent, or Firm* — Fletcher Yoder, P.C.

(57) ABSTRACT

A delay circuit is coupled to a memory device. At least a portion of the delay circuit is disposed in one or more memory banks on one or more memory chips of the memory device. The delay circuit is configured to calibrate an asynchronous signal received at each of the one or more memory banks so that the calibrated asynchronous signal has a common timing relationship with a respective internal command signal received at the corresponding memory bank for all of the one or more memory banks on the memory device. The calibrated asynchronous signals are used in various internal test operations to improve testing accuracy.

20 Claims, 5 Drawing Sheets

ASYNCHRONOUS SIGNAL TO COMMAND TIMING CALIBRATION FOR TESTING ACCURACY

BACKGROUND OF THE INVENTION

Field of the Invention

The present invention relates generally to the field of semiconductor memory devices. More specifically, embodiments of the present disclosure relate to calibrating asynchronous signal to command signal with a same timing relation in the semiconductor memory devices for testing accuracy.

Description of the Related Art

Asynchronous signals are used in semiconductor memory devices for controlling internal test operations. An asynchronous signal is generally routed to each memory bank in a memory chip of a semiconductor memory device with a single route shared by all memory banks in the memory chip to save physical space in the semiconductor memory device. Command signals going to each memory bank in the memory chip are independent of each other. Due to propagation delays (e.g., path impedance, temperature distribution, voltage fluctuations, and so forth), timing between the asynchronous signal and the corresponding command signal received at each memory bank may vary for memory banks located at different physical locations in the memory chip. For instance, command signals propagate less distance to memory banks located at a near section (physical location near the command decoder) of a memory chip than to memory banks located at a far section (physical location far from the command decoder) of the memory chip. Accordingly, timing between the asynchronous signal and the corresponding command signal for each memory bank may vary, which may affect the accuracy of the internal test results. It may be desirable to calibrate the timing between the asynchronous signal and the command signal across memory banks in the same memory device to improve testing accuracy.

BRIEF DESCRIPTION OF THE DRAWINGS

Various aspects of this disclosure may better be understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices exchange data and store the data in memory banks. Each memory bank may include a plurality of memory cells in which data is stored. A group of memory banks may be provided on a memory chip, and a memory device may include one or more memory chips. Internal tests may be conducted to test the performance of memory devices, and calibrations to the memory devices may be needed periodically or on demand.

Asynchronous signals are used in semiconductor memory devices for controlling internal test operations. Command signals going to each memory bank in a memory device have certain timing relationships with a clock signal, and an internal test may be conducted to test an operation for one or more memory banks in the memory device (e.g., on the same memory chip or multiple memory chips) at a certain time on the clock signal. An asynchronous signal is synchronized with the clock signal before being transmitted into the one or more memory banks, and the asynchronous signal received at each of the one or more memory banks may be used as a reference signal for the respective memory bank. To save physical space, the asynchronous signal is generally routed to each memory bank in a memory chip with a single route shared by all memory banks in the memory chip. The command signals going to each memory bank in the memory chip are independent of each other. Due to propagation delays (e.g., path impedance, temperature distribution, voltage fluctuations, and so forth), timing between the asynchronous signal and the corresponding command signal received at each memory bank may vary for memory banks located at different physical locations in the memory chip. Accordingly, as disclosed herein, a delay circuit inside the memory device may be used to calibrate the asynchronous signal received at the one or more memory banks to cause a common timing relationship between the asynchronous signal and corresponding command signal received at the same memory bank for all of the one or more memory banks in the memory device. Accordingly, the test operation may be conducted with improved accuracy by using the asynchronous signal as a reference signal to determine the operation testing time at a corresponding memory bank.

The current disclosure herein provides a delay circuit coupled to a memory device. At least a portion of the delay circuit is disposed in one or more memory banks on one or more memory chips of the memory device. The delay circuit is configured to calibrate an asynchronous signal received at each of the one or more memory banks so that the calibrated asynchronous signal has a common timing relationship with a respective internal command signal received at the corresponding memory bank for all of the one or more memory banks on the memory device. The calibrated asynchronous signals are used in various internal test operations to improve testing accuracy.

Figure 1:
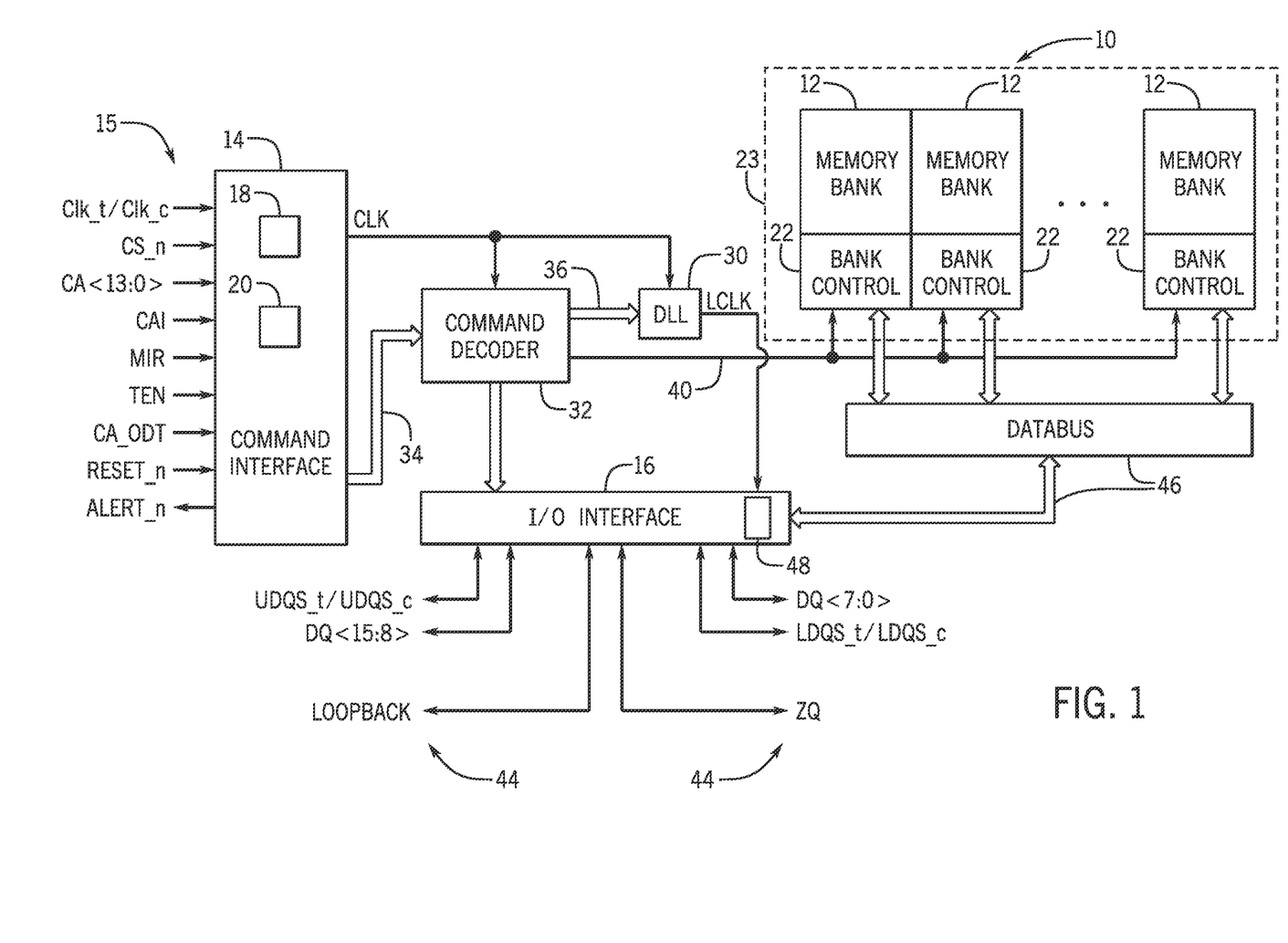
FIG. 1 is a simplified block diagram illustrating certain features of a memory device, according to an embodiment of the present disclosure.

Turning now to the figures, FIG. 1 is a simplified block diagram illustrating certain features of a memory device 10.

Specifically, the block diagram of FIG. 1 is a functional block diagram illustrating certain functionality of the memory device 10. In accordance with one embodiment, the memory device 10 may be a double data rate type five synchronous dynamic random access memory (DDR5 SDRAM) device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., ×8 or ×16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabit (Gb) DDR5 SDRAM, the memory chip may include 16 memory banks 12, arranged into 8 bank groups, each bank group including 2 memory banks. For a 16 GB DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16 configured to exchange (e.g., receive and transmit) signals with external devices. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the complementary clock signal (Clk_c). The positive clock edge for DDR refers to the point where the rising true clock signal Clk_t crosses the falling complementary clock signal Clk_c, while the negative clock edge indicates that transition of the falling true clock signal Clk_t and the rising of the complementary clock signal Clk_c. Commands (e.g., read command, write command, etc.) are typically entered on the positive edges of the clock signal and data is transmitted or received on both the positive and negative clock edges.

The clock input circuit 18 receives the true clock signal (Clk_t) and the complementary clock signal (Clk_c) and generates an internal clock signal CLK. The internal clock signal CLK is supplied to an internal clock generator 30, such as a delay locked loop (DLL) circuit. The internal clock generator 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the internal clock generator 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12. A group of the memory banks 12 may be included in a memory chip 23, and the memory device 10 may include one or more memory chips.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_c). The command interface may include a command address input circuit 20 which is configured to receive and transmit the commands to provide access to the memory banks 12, through the command decoder 32, for instance. In addition, the command interface 14 may receive a chip select signal (CS_n). The chip select signal CS_n enables the memory device 10 to process commands on the incoming command/address signals CA<13:0> for the memory chip selected by the chip select signal CS_n. Accordingly, access to specific banks 12 within the memory device 10 is facilitated by the information encoded on the chip select signal CS_n and the command/address signals CA<13:0>.

In addition, the command interface 14 may be configured to receive a number of other command signals. For instance, a command/address on die termination (CA_ODT) signal may be provided to facilitate proper impedance matching within the memory device 10. A reset command (RESET_n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the data bus 46, which includes a plurality of bi-directional data buses. Data I/O signals, generally referred to as DQ signals, are generally transmitted and received in one or more bi-directional data busses. For certain memory devices, such as a DDR5 SDRAM memory device, the I/O signals may be divided into upper and lower bytes. For instance, for an ×16 memory device, the I/O signals may be divided into upper and lower I/O signals (e.g., DQ<15:8> and DQ<7:0>) corresponding to upper and lower bytes of the data signals, for instance.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_c), the data strobe (DQS) signals may be provided as a differential pair of data strobe signals (DQS_t and DQS_c) to provide differential pair signaling during reads and writes. For certain memory devices, such as a DDR5 SDRAM memory device, the differential pairs of DQS signals may be divided into upper and lower data strobe signals (e.g., UDQS_t and UDQS_c; LDQS_t and LDQS_c) corresponding to upper and lower bytes of data sent to and from the memory device 10, for instance.

An impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

In some embodiments, the memory device 10 may be disposed in (physically integrated into or otherwise connected to) a host device or otherwise coupled to a host device. The host device may include any one of a desktop computer, laptop computer, pager, cellular phone, personal organizer, portable audio player, control circuit, camera, etc. The host device may also be a network node, such as a router, a server, or a client (e.g., one of the previously-described types of computers). The host device may be some other sort of electronic device, such as a copier, a scanner, a printer, a game console, a television, a set-top video distribution or recording system, a cable box, a personal digital media player, a factory automation system, an automotive computer system, or a medical device. (The terms used to describe these various examples of systems, like many of the other terms used herein, may share some referents and, as such, should not be construed narrowly in virtue of the other items listed.)

The host device may, thus, be a processor-based device, which may include a processor, such as a microprocessor, that controls the processing of system functions and requests in the host. Further, any host processor may comprise a plurality of processors that share system control. The host processor may be coupled directly or indirectly to additional system elements of the host, such that the host processor controls the operation of the host by executing instructions that may be stored within the host or external to the host.

As discussed above, data may be written to and read from the memory device 10, for example, by the host whereby the memory device 10 operates as volatile memory, such as Double Data Rate DRAM (e.g., DDR5 SDRAM). The host may, in some embodiments, also include separate non-volatile memory, such as read-only memory (ROM), PC-RAM, silicon-oxide-nitride-oxide-silicon (SONOS) memory, metal-oxide-nitride-oxide-silicon (MONOS) memory, polysilicon floating gate based memory, and/or other types of flash memory of various architectures (e.g., NAND memory, NOR memory, etc.) as well as other types of memory devices (e.g., storage), such as solid state drives (SSD's), MultimediaMediaCards (MMC's), SecureDigital (SD) cards, CompactFlash (CF) cards, or any other suitable device. Further, it should be appreciated that the host may include one or more external interfaces, such as Universal Serial Bus (USB), Peripheral Component Interconnect (PCI), PCI Express (PCI-E), Small Computer System Interface (SCSI), IEEE 1394 (Firewire), or any other suitable interface as well as one or more input devices to allow a user to input data into the host, for example, buttons, switching elements, a keyboard, a light pen, a stylus, a mouse, and/or a voice recognition system, for instance. The host may optionally also include an output device, such as a display coupled to the processor and a network interface device, such as a Network Interface Card (NIC), for interfacing with a network, such as the Internet. As will be appreciated, the host may include many other components, depending on the application of the host.

The host may operate to transfer data to the memory device 10 for storage and may read data from the memory device 10 to perform various operations at the host. Accordingly, to facilitate these data transmissions, in some embodiments, the I/O interface 16 may include a data transceiver 48 that operates to receive and transmit DQ signals to and from the I/O interface 16.

Figure 2:
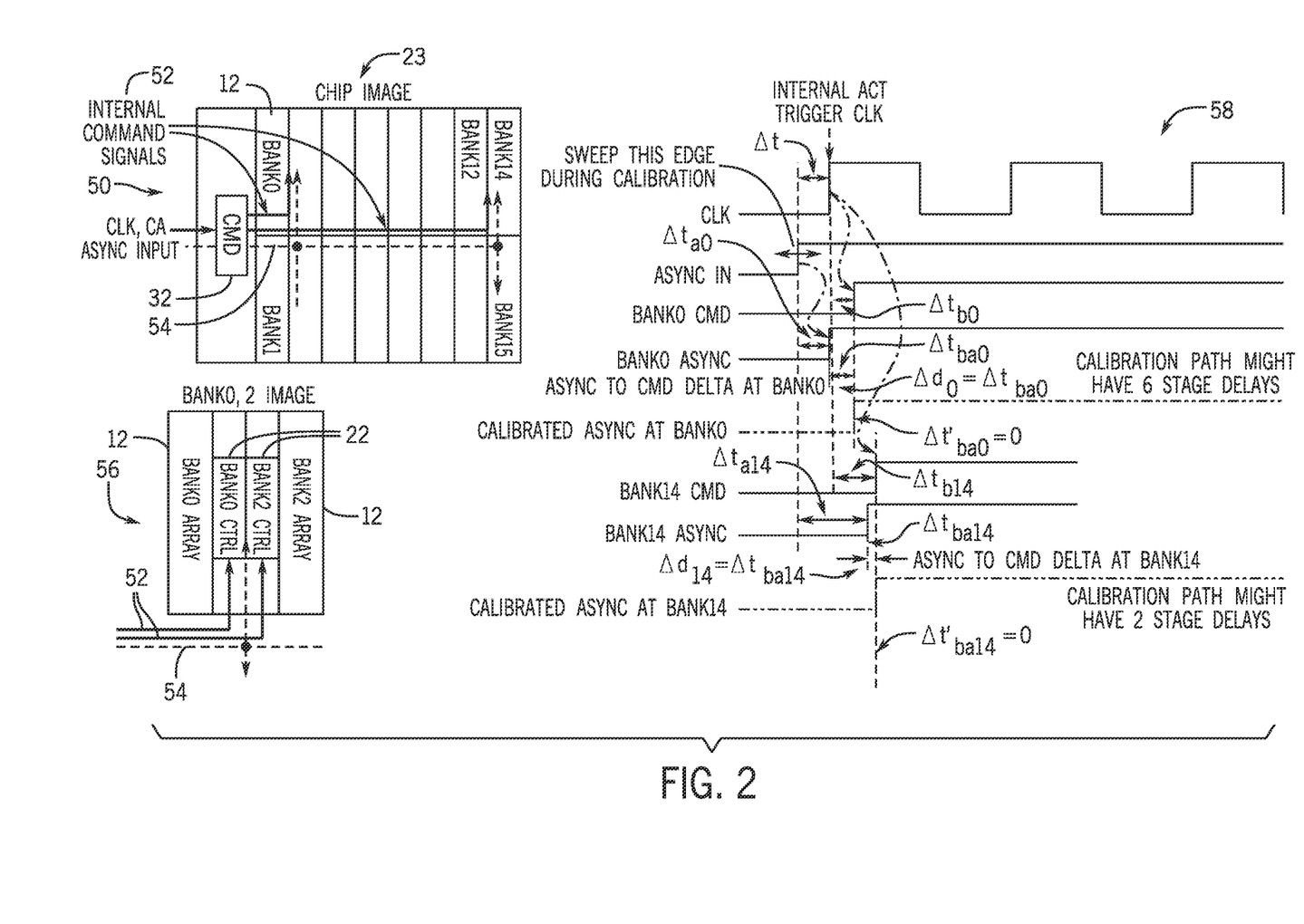
FIG. 2 illustrates a block diagram illustrating signals transmitting in a memory chip of FIG. 1, according to an embodiment of the present disclosure.

FIG. 2 illustrates an embodiment of signals transmitting in a memory chip 23 and their timings relative to each other. A diagram 50 illustrates signals transmitting in the memory chip 23. In the diagram 50, the command decoder (CMD) 32 may receive command signals from the command interface 14 through the command bus 34 and decode the command signals to provide various internal command signals 52 to respective memory banks 12 (e.g., Bank0, Bank1 . . . Bank14, Bank15). It should be noted that more or less memory banks (e.g., more than 16) may be included in memory chip 23 in other embodiments. The command decoder 32 may also receive a clock signal CLK from the command interface 14. The internal command signals 52 are synchronized with the clock signal CLK.

During an internal test operation, the command decoder 32 may receive an asynchronous signal (Async input) to control the internal test operation for various test steps. To save physical space in the memory device 10, the asynchronous signal is generally routed to each memory bank in the memory chip 23 with a single route 54 shared by all memory banks 12 in the memory chip 23, as illustrated in the diagram 50. The internal command signals 52 going to each memory bank 12 in the memory chip 23 are independent of each other, as will be illustrated in a diagram 56. The diagram 56 illustrates the internal command signals 52 and the asynchronous signal transmitting along the single route 54 into corresponding bank controllers 22 of the Bank0 and Bank2, respectively.

Figure 3:
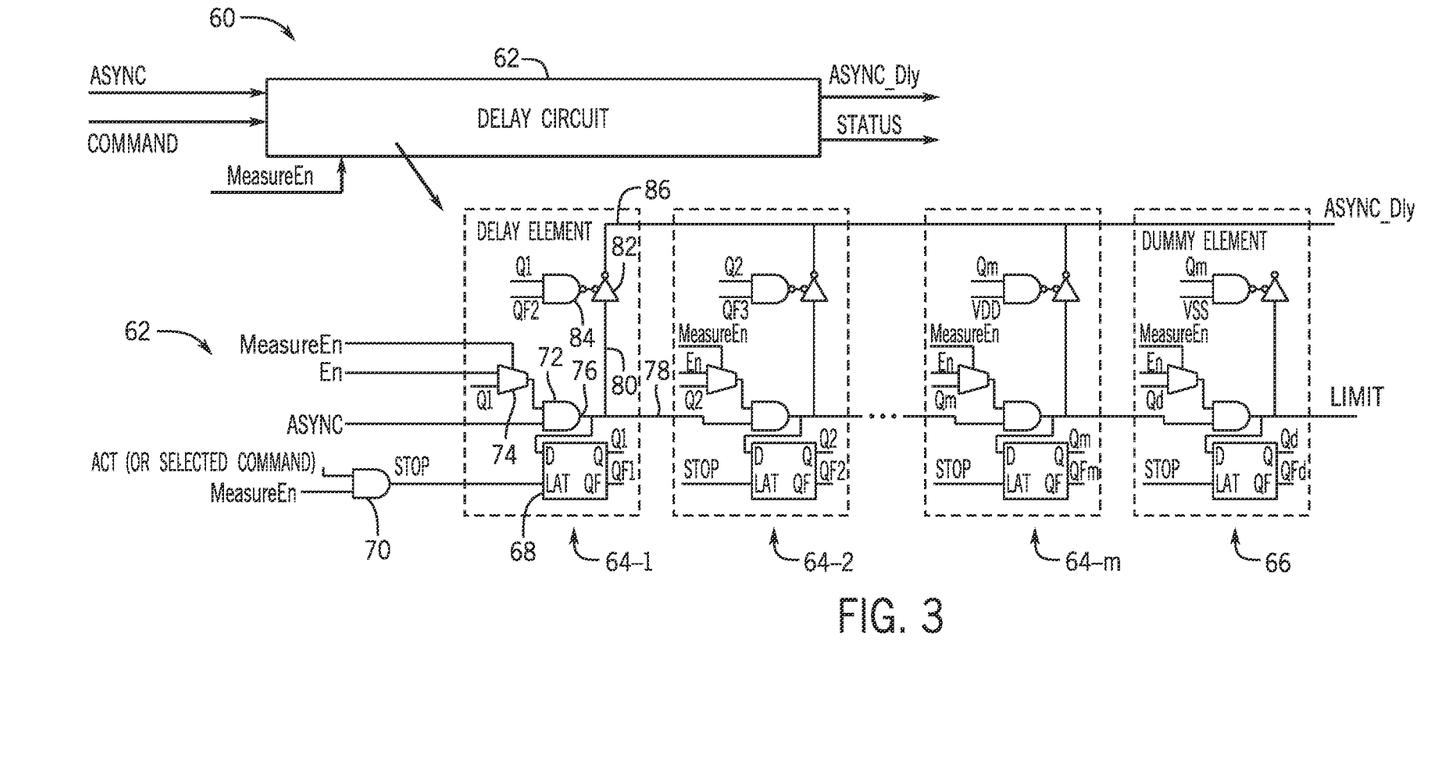
FIG. 3 illustrates a block diagram of an embodiment of a delay device used in a memory bank of the memory chip of FIG. 2, according to an embodiment of the present disclosure.

A timing diagram 58 is used to illustrate an embodiment of timing relationships between the internal command signal 52 and the asynchronous signal received at each memory bank 12 of the memory chip 23. As illustrated in the diagram 58, the asynchronous signal (Async In, i.e., Async input) received at the command decoder 32 is synchronized to the clock signal CLK with a timing Δt relative to the internal ACT trigger edge on the clock signal CLK. Bank0 Cmd is the internal command signal 52 received at the Bank0, and Bank0 Async is the asynchronous signal received at the Bank0. Bank14 Cmd is the internal command signal 52 received at the Bank14, and Bank14 Async is the asynchronous signal received at the Bank14 (signals received at other memory banks in the chip 23 are not illustrated in the diagram 58). The internal command signal 52 received at each memory bank 12 has a timing relationship with the clock signal CLK as $\Delta t_{bn}$, n=0, 1, 2, 3 . . . 15, where n indicates a reference number for the respective memory bank 12. For example, the internal command signal 52 received at the Bank0 has a timing $\Delta t_{b0}$ relative to the clock signal CLK, and the internal command signal 52 received at the Bank14 has a timing $\Delta t_{b14}$ relative to the clock signal CLK, as illustrated in the diagram 58. The timing relationship between the asynchronous signal received at each memory bank 12 and the asynchronous signal (Async In, i.e., Async input) received at the command decoder 32 is $\Delta t_{an}$, n=0, 1, 2, 3 . . . 15, where n indicates the reference number for the respective memory bank 12. For example, the asynchronous signal received at the Bank0 has a timing $\Delta t_{a0}$ with the Async In signal, and the asynchronous signal received at the Bank14 has a timing $\Delta t_{a14}$ with the Async In, as illustrated in the diagram 58. The timing relationship between the internal command signal 52 and the asynchronous signal received at each memory bank 12 is $\Delta t_{ban}$, n=0, 1, 2, 3 . . . 15, where n indicates the reference number for the respective memory bank 12. Accordingly, equation (1) is representative of described the relationship:

$$\Delta t_{ban}=\Delta t+\Delta t_{bn}-\Delta t_{an}, \ n=0,1,2\ldots15, \quad (1)$$

where n indicates the reference number for the respective memory bank 12. The $\Delta t_{an}$ is expected to have the same value (or negligible difference) as the $\Delta t_{bn}$ since the internal command signal 52 and the asynchronous signal (Async In) transmit from the command decoder 32 to the same memory bank 12 following the same route. Consequently, $\Delta t_{ban}$ is expected to have the value of Δt for all memory banks 12 in the memory chip 23. However, the asynchronous signal (Async In) is using a single route shared by all memory banks in the memory chip 23 to save physical space, consequently, $\Delta t_{an}$ is affected by the path impedance, temperature distribution, uneven loads, voltage fluctuations, and the like across the whole memory chip 23, which may cause $\Delta t_{an}$ to have different values than $\Delta t_{bn}$. The differences between $\Delta t_{an}$ and $\Delta t_{bn}$ are related to the locations of the memory banks 12 in the memory chip 23. That is, the difference between $\Delta t_{an}$ and $\Delta t_{bn}$ may be different for different memory banks 12 (i.e., $\Delta t_{bn}-\Delta t_{an}$ may have different value for different number n), and $\Delta t_{ban}$ may have different values for different memory banks 12 in the memory chip 23. Accordingly, timing errors may arise during the internal test operations for the memory banks since $\Delta t_{ban}$ may have different values for different memory banks 12 in the memory chip 23. The timing accuracy for the internal test operations may be improved by adding a time delay $\Delta d_n$ to the equation (1), such that:

$$\Delta t'_{ban}=\Delta t+\Delta t_{bn}-(\Delta t_{an}+\Delta d_n)=\Delta t_{ban}-\Delta d_n, \ \Delta d_n\geq 0, \ n=0,1,2\ldots15 \quad (2)$$

where n indicates the reference number for the respective memory bank 12. $\Delta d_n$ is a time delay generated for the respective asynchronous signal received at the corresponding memory bank 12, and the resulting calibrated asynchronous signal has a timing $\Delta t'_{ban}$ to the internal command signal 52 received at the corresponding memory bank 12. For example, $\Delta t'_{ba0}$ is the timing relationship between the Bank0 Cmd and the calibrated asynchronous signal at Bank0 (Calibrated Async at Bank0), and $\Delta t'_{ba14}$ is the timing relationship between the Bank14 Cmd and the calibrated asynchronous signal at Bank14 (Calibrated Async at Bank14). The values of the $\Delta d_n$ for the memory banks 12 are determined so that $\Delta t'_{ban}$ has a fixed value for all memory banks 12 in the memory chip 23. For example, $\Delta t'_{ban}$ may have a value 0 when $\Delta d_n=(\Delta t_{bn}-\Delta t_{an}+\Delta t)$ for all memory banks 12 in the memory chip 23 (i.e., $\Delta t'_{ba0}=\Delta t'_{ba1}=\Delta t'_{ba2}\ldots=\Delta t'_{ba15}=0$), as illustrated in the diagram 58. In the illustrated embodiment, $\Delta d_0=(\Delta t_{b0}-\Delta t_{a0}+\Delta t)=\Delta t_{ba0}$ for Bank0 (i.e., n=0), and $\Delta d_{14}=(\Delta t_{b14}-\Delta t_{a14}+\Delta t)=\Delta t_{ba14}$ for Bank14 (i.e., n=14). Because time delay $\Delta d_n$ is a value equal to or more than zero, for a given value of Δt, there is a value range for $\Delta d_n$, which is related to the property of the memory chip 23 (i.e., $\Delta t_{bn}-\Delta t_{an}$). It is beneficial to have $\Delta d_n$ generated in each memory bank 12 for the asynchronous signal received at the respective memory bank 12, which may reduce errors generated by the propagation delays, as illustrated in FIG. 3.

FIG. 3 illustrates a block diagram 60 of an embodiment of a delay circuit 62 that may be used to calibrate the asynchronous signal received at the respective memory bank 12 of the memory chip of FIG. 2 and generate the time delay $\Delta d_n$ for the respective asynchronous signal. The delay circuit 62 may receive the respective asynchronous signal (e.g., Bank0 Async), the respective internal command signal 52 (e.g., Bank0 Cmd), and a measure enable (MeasureEn) signal. The delay circuit 62 may include one or more delay elements 64, which are coupled together to form a delay chain (e.g., a daisy chain). Each delay element 64 is configured to generate a time delay $\Delta r$, which is the minimum time delay (i.e., the resolution of the delay circuit 62) that can be generated using the delay circuit 62. The delay chain in the delay circuit 62 may include a total number of m (m=1, 2 . . . ) delay elements 64 to form the delay chain and a dummy element 66 at the end of the delay chain. The delay elements 64 are aligned in order to form the delay chain, e.g., an output from the first delay element 64-1 is an input into the second delay element 64-2, an output from the second delay element 64-2 is an input into the third delay element 64-3, and so on. The last delay element 64-$m$ is coupled to the dummy element 66, as illustrated in the diagram 62 of FIG. 3. The dummy element 66 may have similar structure as the delay element 64 and may be used as an indication of the end of the delay chain in the delay circuit 62 (e.g., indication of limit). The delay circuit 62 may output the delayed asynchronous signal (Async_Dly) and a status of the delay chain, which is described in details hereafter.

Each delay element 64 may include a flip flop circuit (FF) 68, which is used to capture the transitions or edges (e.g., transition of value from 0 to 1 corresponds to rising edge) of the asynchronous signal received at the respective memory bank 12 with ACT (or selected command signal), i.e., the internal command signal 52. The flip flop circuit 68 may have a first input pin D and a second input pin LAT. A signal to the second input LAT is received from a switch 70 (e.g., a logic gate), which enables/disables the input of the ACT (or selected command signal), i.e., the internal command signal 52, for the calibration. A signal to the first input D is received from a switch 72 (e.g., a logic gate, such as an AND gate), which enables/disables the input of the asynchronous signal received at the respective memory bank 12 for the calibration based on an output $Q_h$ (h=1, 2 . . . m) signal from an output pin Q of the flip flop circuit 68 of the respective delay element 64-$h$ at a preceding time. Here, h is the order of the delay elements 64 in the delay chain of the delay circuit 62, e.g., $Q_1$ corresponds to an output signal of the flip flop circuit 68 in the first delay element 64-1 in the delay chain of the delay circuit 62; and $Q_2$ corresponds to an output signal of the flip flop circuit 68 in the second delay element 64-2 in the delay chain of the delay circuit 62, and so on. The values of $Q_h$ indicate whether the transitions or edges (e.g., transition of value from 0 to 1 corresponds to rising edge) of the asynchronous signal received at the respective memory bank 12 are captured by the ACT (or selected command signal), i.e., the internal command signal 52 at calibration time. In addition, the values in the flip flop circuit 68 of each delay element 64-$h$ (h=1, 2 . . . m) may be set during measurement or calibration time only. For example, the flip flop circuit 68 may have a truth table as shown in table 1 below, where D value and LAT value are values at the respective input pins of the flip flop circuit 68, and Q value and QF value are values at the respective output pins of the flip flop circuit 68, and QF value is the inverted value of Q value as illustrated in the diagram 62 of FIG. 3.

TABLE 1

| D value | LAT value | Q value | QF value |
|---------|-----------|---------|----------|
| 1 | rising edge | 1 | 0 |
| 0 | rising edge | 0 | 1 |

Since the asynchronous signal received at the respective delay element 64-$h$ is input into the flip flop circuit 68 through the D input pin, and the ACT (or selected command signal), i.e., the internal command signal 52, is input into the flip flop circuit 68 through the LAT input pin, Table 1 indicates that the output signal $Q_h$ from the output pin Q has value 1 when the transitions or edges of the asynchronous signal received at the respective delay element 64-$h$ (e.g., transition of value from 0 to 1 corresponds to rising edge) are captured by the ACT (or selected command signal), i.e., the internal command signal 52; and the output signal $Q_h$ from the output pin Q has value 0 when the transitions or edges (e.g., transition of value from 0 to 1 corresponds to rising edge) of the asynchronous signal received at the respective delay element 64-$h$ are not captured by the ACT (or selected command signal), i.e., the internal command signal 52. Operation in accordance with the truth table 1 is illustrated in FIG. 4.

For example, the switch 72 in the delay element 64-1 may receive a signal from a selection device 74 (e.g., a multiplexer), which may select an output from one of two inputs, $Q_1$ and En (forced high signal), based on whether the respective memory bank 12 is under a calibration mode or a run mode, which is selected by a mode selection signal, MeasureEn, of the selection device 74. When the respective memory bank 12 is under calibration mode, MeasureEn is set high, which enables the switch 72, and En is selected by the selection device 74 as the output to the switch 72, and the asynchronous signal that is delayed by $\Delta r$, which is related to the generation of the $Q_1$ by the delay element 64-1, may be output from the switch 72 as En is an always forced high signal. The time delay $\Delta r$ is related to a processing time for the flip flop circuit 68 to generate the output $Q_1$. In the illustrated embodiment, each delay element 64 may generate the same time delay $\Delta r$. In other embodiments, different delay elements 64 may generate different time delays. When the respective memory bank 12 is under run mode, $Q_1$ is selected by the selection device 74 as the output to the switch 72 and the asynchronous signal that is delayed by $\Delta r$ may be selectively output from the switch 72 depends on the value of $Q_1$.

For example, under calibration mode, when $Q_1$ has a value of 1, which means the transitions or edges (e.g., transition of value from 0 to 1 corresponds to rising edge) of the asynchronous signal received at the respective delay element 64-1 are captured by the ACT (or selected command signal), i.e., the internal command signal 52, the asynchronous signal that is delayed by the delay element 64-1 may be transmitted from an output 76 of the switch 72 and transmitted via a path 78 to the next delay element 64-2 and used by the flip flop circuit 68 in the delay element 64-2 to generate $Q_2$, and the asynchronous signal that is delayed by the delay element 64-1 and 64-2 may be transmitted to the next delay element 64-3 and used by the flip flop circuit 68 in the delay element 64-3 to generate $Q_3$, and so on. The asynchronous signal that is delayed by a certain delay element 64-$h$ may be transmitted from the output 76 of the switch 72 of the delay element 64-*h* and transmitted via a path 80 to a switch 82 of the delay element 64-*h*. Based on an output from a control device of 84 of the delay element 64-*h*, the switch 82 of the delay element 64-*h* may output the delayed asynchronous signal along a path 86 (i.e., Async_Dly) which is determined by values of $Q_h$ and $QF_{h+1}$ (h=1, 2 . . . m), as illustrated in FIG. 4.

Figure 4:
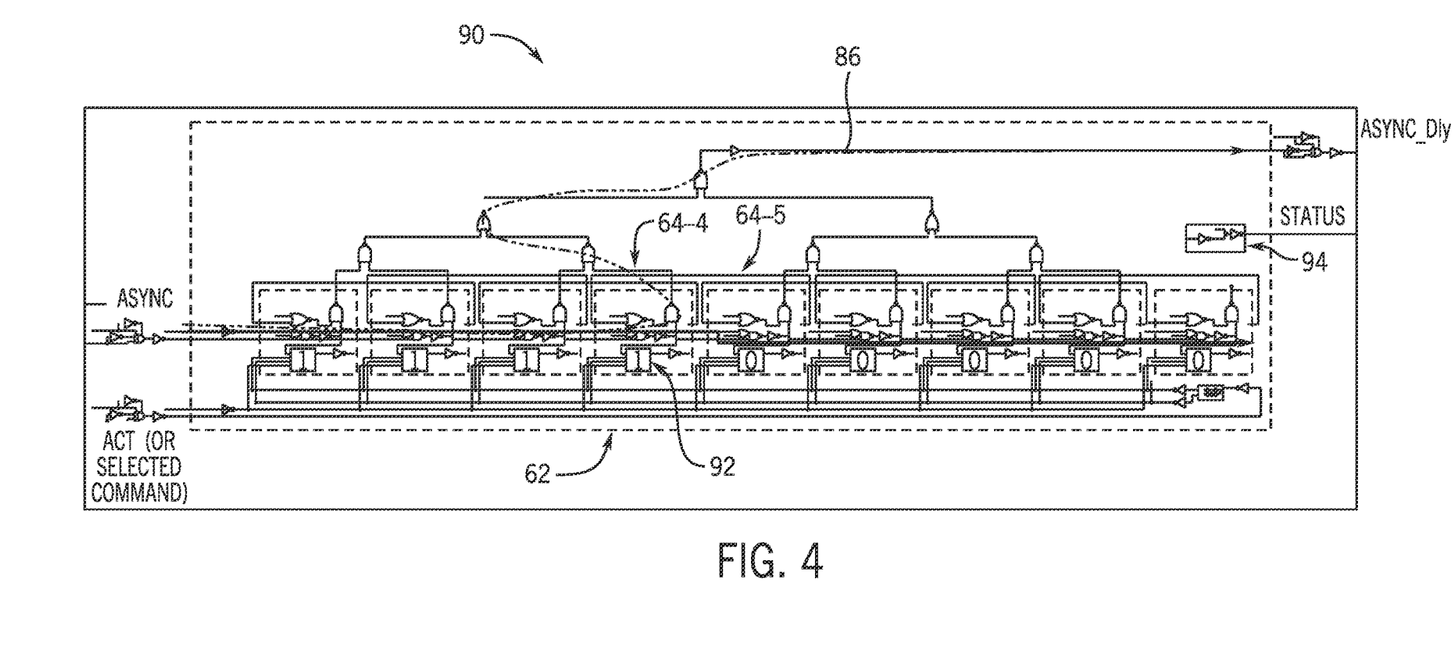
FIG. 4 illustrates a schematic diagram of an embodiment of FIG. 3, according to an embodiment of the present disclosure.

FIG. 4 illustrates a schematic diagram 90 of an embodiment of FIG. 3. In FIG. 4, during the calibration, when $QF_5$ in the 5$^{th}$ delay element 64-5 has a value of 1 (i.e., $Q_5$ has a value of 0, since QF is the inverted value of Q), the switch 80 of the delay element 64-4 may output the delayed asynchronous signal through the path 86 as the delayed asynchronous signal (Async_Dly) for the respective memory bank 12. According to the table 1, when $Q_h$ (corresponding to D in table 1) has the value of 0, the transitions or edges (e.g., transition of value from 0 to 1 corresponds to rising edge) of the asynchronous signal received at the respective delay element 64-*h* are captured by the ACT (or selected command signal), i.e., the internal command signal 52. In the illustrated embodiment in FIG. 4, all the delay elements 64-*h* (h≥5) after the delay element 64-4 on the delay chain of the delay circuit 62 may have $Q_h$ equal to 0 according to table 1 and FIG. 2. Consequently, only the delay element 64-4 may output a signal from the respective switch 82 of the delay element 64-4. That is, the delay element 64-4 is a transition point 92 for the output Q of the flip flop circuit 68, i.e., the value of $Q_h$ is different from $Q_{h+1}$, and the switch 82 is turned on only when the $Q_h$ values of the two adjacent delay elements 64 are different (e.g., $Q_4$=1 and $Q_5$=0 in the illustrated embodiment). The values of $Q_h$ may be stored in the respective flip flop circuit 68, and may be changed during the next calibration process.

The transition point 92 may be determined for each memory bank 12 under calibration, which may be disposed in one or more memory chips of the memory device 10, by sweeping the rising edge of the asynchronous signal (Async In, i.e., Async input) received at the command decoder 32 around the internal ACT trigger edge on the clock signal CLK, i.e., changing the timing Δt, as illustrated in FIG. 2. The values of $Q_1$ and $Q_m$ of each memory bank 12 (m is the total number of delay elements 64 in the delay circuit 62 of the respective memory bank 12) may be used to determine the capture status of the transitions or edges (e.g., transition of value from 0 to 1 corresponds to rising edge) of the asynchronous signal received at the respective memory bank 12. For instance, when the transition point 92 is within a delay chain of a respective delay circuit 62 of a memory bank 12, the values of $Q_1$ and $Q_m$ are different (except when m=1, i.e., there is only one delay element 64 in the delay chain, then other information/devices may be needed to determine the capture status of the corresponding memory bank 12). A status circuit 94 may be used to check the capture status of each memory bank 12 so that a certain outcome (e.g., 1 or 0) may be obtained only when the values of $Q_1$ and $Q_m$ are different, which indicates that the transition point 92 is generated in the respective delay chain. For example, the status circuit 94 may have a logic of ($Q_1$ AND $QF_m$), which only outputs 1 when the values of $Q_1$ and $QF_m$ are the same, i.e., when values of $Q_1$ and $Q_m$ are different. The delay circuit 62 in each memory bank 12 may output the result of the status circuit 94 via the status signal. The capture status of all memory banks 12 under calibration, which may be disposed in one or more memory chips of the memory device 10, may be checked before the completion of the calibration to confirm that a respective transition point 92 is generated within the respective delay chain of each memory bank 12. For example, a logic circuit (AND) may be used to check the status signals from all memory banks under calibration, and an outcome value of 1 may be obtained when a respective transition point 92 is within the respective delay chain of each memory bank 12 under calibration.

It should be noted that falling edges (e.g., transition of value from 1 to 0 corresponds to falling edge) of the asynchronous signal received at the respective delay element 64-*h* or falling edges of the ACT (or selected command signal), i.e., the internal command signal 52, may also be used to calibrate the asynchronous signals. It also should be understood that logically-equivalent circuitry may be used herein to implement the systems and methods described. For example, a logical XOR gate may be replaced via a logically-equivalent combination of NOT gates, AND gates, Inverse NOT gates, OR gates, NAND gates, NOR gates, or the like.

Figure 5:
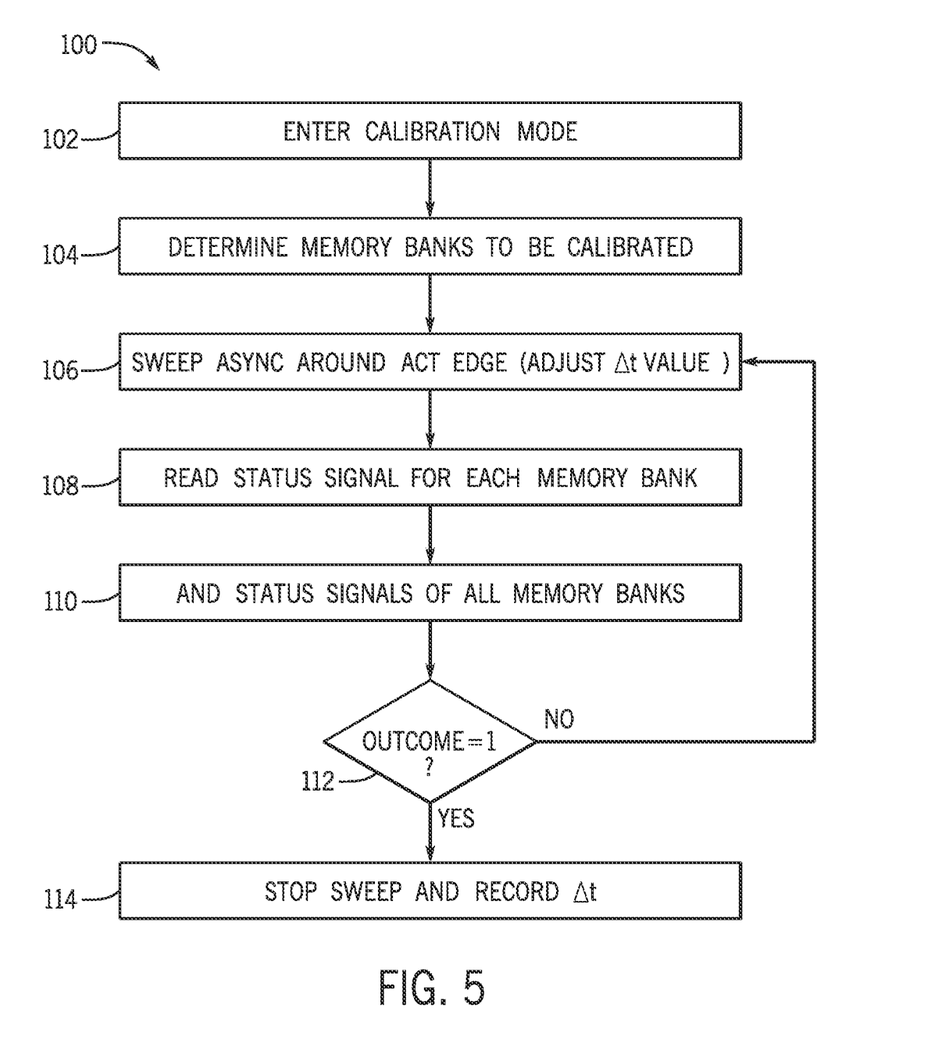
FIG. 5 illustrates a flow diagram of a method for implementing delay devices, according to an embodiment of the present disclosure.

FIG. 5 illustrates a flow diagram of a method 100 for implementing delay circuits 62 to calibrate the asynchronous signal received in each memory bank 12 that is under calibration in the memory device 10. At block 102, the command decoder 32 may receive a command to enter calibration mode, and a CLK signal for calibration and an asynchronous signal (Async In) may be enabled.

Under the calibration mode, the command decoder 32 may receive identifications of memory banks 12 to be calibrated at block 104. For example, the command decoder 32 may receive addresses of memory banks 12 to be calibrated, e.g., addresses of corresponding memory chips and/or addresses of memory banks 12 inside the corresponding memory chips (e.g., Bank0, Bank1 . . . ). In some embodiment, the memory banks 12 to be calibrated may be located in the same memory chip 23 when the related internal test operations require memory banks 12 in the same memory chip 23 to be calibrated. In some embodiment, the memory banks 12 to be calibrated may be located in different memory chips 23 when the related internal test operations require memory banks 12 in different memory chips 23 to be calibrated. For instance, calibration may be conducted for a respective memory bank 12 (e.g., Bank0) in more than one memory chips 23 in the memory device 10. For example, the internal test operations may require turning on sense amplifier at each memory bank 12 in the same memory chip 23 at a certain moment, and the asynchronous signal received at each memory bank 12 in the same memory chip 23 may need to be calibrated to provide accurate timing to control the sense amplifier at each memory bank 12 in the same memory chip 23. In another example, the internal test operations may require turning on sense amplifiers for corresponding Bank0 in more than one memory chips 23, and the asynchronous signal received at each Bank0 in the corresponding memory chips 23 may need to be calibrated to provide accurate timing to control the corresponding sense amplifier at the respective Bank0 in different memory chips 23. It should be noted that, calibration may be conducted for memory banks 12 with different bank addresses in different memory chips, e.g., Bank0 in one memory chip while Bank15 in another memory chip. Accordingly, the memory banks 12 selected for calibration are determined based on related internal test operations. In some embodiment, several memory banks 12 located at a same distance from the command decoder 32 may share the same calibrated asynchronous signal generated by either one of them. Accordingly, in the above described embodiment, only a portion of the memory banks 12 in the memory device 10 may be selected for calibration.

After the memory banks 12 selected for calibration are determined, at block 106, the asynchronous signal (Async In) is controlled to sweep around an internal ACT trigger edge on the clock signal CLK with a changing time delay, $\Delta t$, as illustrated in the diagram 58 of FIG. 2.

At block 108, status signals for each memory bank 12 under calibration are read from corresponding status circuit 94 in each memory bank 12. As described above, the status signal of each memory bank 12 is determined based on values of the respective $Q_1$ and $Q_m$ (m is the total number of delay elements 64 in the respective memory bank 12) of each memory bank 12, which indicates whether the transition point 92 is in the respective memory bank 12. For example, the corresponding status signal may have a value of 0 when no transition point is detected in the respective memory bank 12 (e.g., $Q_1=Q_m$).

At block 110, status signals from all memory banks 12 under calibration are checked (e.g., AND together) to determine whether a respective transition point 92 is detected in each memory bank 12 under calibration.

At block 112, based on the outcome of block 110, determination is made of whether a respective transition point 92 is detected in each memory bank 12 under calibration. For example, in the illustrated embodiment in FIG. 5, when a respective transition point 92 is detected in each memory bank 12 under calibration, the outcome from the block 110 is 1, otherwise the outcome from the block 110 is 0. In the illustrated embodiment, when the outcome from the block 110 is 0, which means a respective transition point 92 is not detected in each memory bank 12 under calibration, repeat from block 106 to block 112 to continue sweeping the asynchronous signal (Async In) around the internal ACT trigger edge on the clock signal CLK with the changing time delay, $\Delta t$. In the illustrated embodiment, when the outcome from the block 110 is 1, which means the respective transition point 92 is detected in each memory bank 12 under calibration, stop sweeping the asynchronous signal (Async In) around the internal ACT trigger edge on the clock signal CLK and record the $\Delta t$ at block 114. After the calibration, the $\Delta t$ may be used in internal test operations.

Accordingly, the technical effects of the present disclosure include a method and system for calibrating asynchronous signal to command signal with a same timing relation in the semiconductor memory devices for testing accuracy.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A delay circuit, comprising:
    one or more delay elements disposed on one or more memory chips of a memory device, wherein each of the one or more delay elements is configured to generate a respective time delay for a reference signal transmitted from a command decoder of the memory device to the respective delay element of the one or more delay elements,
    and wherein the delay circuit is configured to generate one or more calibrated reference signals based on a command signal received at the command decoder by adjusting a time delay between the reference signal and the command signal at the command decoder.

2. The delay circuit of claim 1, wherein each of the one or more delay elements comprises a respective flip flop circuit.

3. The delay circuit of claim 2, wherein a respective status value is stored in the respective flip flop circuit of each of the one or more delay elements, wherein the respective status value is associated with the respective time delay for the reference signal received at each of the one or more delay elements.

4. The delay circuit of claim 3, wherein one or more internal command signals are generated by the command decoder of the memory device based on the command signal received at the command decoder, and the one or more internal command signals are used to generate the respective time delay for the reference signal received at each of the one or more delay elements.

5. The delay circuit of claim 3, wherein a calibrated reference signal is output from a particular delay element of the one or more delay elements in response to a status value stored in a corresponding flip flop circuit of the particular delay element having a particular value.

6. The delay circuit of claim 3, wherein at least two status values stored in the flip flop circuits of the one or more delay elements are transmitted to a status circuit in the memory device to obtain a status signal.

7. The delay circuit of claim 1, wherein the respective time delay generated by each of the one or more delay elements has a same maximum value.

8. The delay circuit of claim 1, wherein the reference signal is used for internal testing of the memory device.

9. The delay circuit of claim 1, wherein at least two of the one or more delay elements are coupled together in sequence.

10. A method, comprising:
    receiving a reference signal at each of one or more delay elements disposed in a memory device, wherein the reference signal has a first time delay with a command signal at a command decoder of the memory device;
    generating a respective time delay for the reference signal received at each of the one or more delay elements based on the command signal received at each of the one or more delay elements;
    generating a respective status value for each of the one or more delay elements based on the respective time delay generated for the reference signal received at each of the one or more delay elements;
    generating a status signal, via a status circuit, based on at least two of the status values for the one or more delay elements;
    in response to the status signal having a first value, adjusting the value of the first time delay and repeating the generating of the status signal by using the adjusted value of the first time delay; and
    in response to the status signal having a second value, recording the first time delay.

11. The method of claim 10, wherein each of the one or more delay elements comprises a respective flip flop circuit.

12. The method of claim 11, wherein the respective status value is stored in the respective flip flop circuit of each of the one or more delay elements.

13. The method of claim 12, wherein a calibrated reference signal is output from a particular delay element of the one or more delay elements in response to a status value stored in a corresponding flip flop circuit of the particular delay element having a particular value.

14. The method of claim 10, wherein the respective time delay generated by each of the one or more delay elements disposed on the memory device has a same maximum value for all the one or more delay elements.

15. The method of claim 10, wherein the reference signal is used for internal test of the memory device.

16. The method of claim 10, wherein at least two of the one or more delay elements are coupled together in sequence.

17. A circuit comprising:
a delay chain, disposed on a memory chip, comprising at least two delay elements, wherein the delay chain is configured to generate a particular time delay for a reference signal transmitted from a command decoder to the delay chain; and
a status circuit configured to:
receive a first status value from a first delay element of the delay chain disposed on the memory chip, wherein the first status value is associated with a first time delay generated for the reference signal by the first delay element;
receive a second status value from a last delay element of the delay chain disposed on the memory chip, and wherein the second status value is associated with a second time delay generated for the reference signal by the last delay element; and
generate a status signal based on the first status value and the second status value.

18. The status circuit of claim 17, wherein the first delay element comprises a flip flop circuit to store the first status value.

19. The status circuit of claim 17, wherein the status signal is transmitted to an additional circuit when the first status value and the second status value are different.

20. The status circuit of claim 17, wherein the at least two delay elements in the delay chain are coupled together in sequence.

* * * * *

UNITED STATES PATENT AND TRADEMARK OFFICE
CERTIFICATE OF CORRECTION

PATENT NO. : 11,955,160 B2
APPLICATION NO. : 17/846967
DATED : April 9, 2024
INVENTOR(S) : Yoshinori Fujiwara et al.

It is certified that error appears in the above-identified patent and that said Letters Patent is hereby corrected as shown below:

In the Claims

In Column 16, Line 8 please delete "The status circuit of claim 17" and insert --The circuit of claim 17--, therefor.

In Column 16, Line 11 please delete "The status circuit of claim 17" and insert --The circuit of claim 17--, therefor.

In Column 16, Line 14 please delete "The status circuit of claim 17" and insert --The circuit of claim 17--, therefor.

Signed and Sealed this
Fourth Day of June, 2024

Katherine Kelly Vidal
*Director of the United States Patent and Trademark Office*